United States Patent
Prasad et al.

(10) Patent No.: US 6,281,452 B1
(45) Date of Patent: Aug. 28, 2001

(54) MULTI-LEVEL THIN-FILM ELECTRONIC PACKAGING STRUCTURE AND RELATED METHOD

(75) Inventors: Chandrika Prasad, Wappingers Falls; Roy Yu, Poughkeepsie; Richard L. Canull, Pleasant Valley; Giulio DiGiacomo, Hopewell Junction; Ajay P. Giri, Poughkeepsie; Lewis S. Goldmann, Bedford; Kimberley A. Kelly, Poughkeepsie; Bouwe W. Leenstra, Walden; Voya R. Markovich, Broome; Eric D. Perfecto, Poughkeepsie; Sampath Purushothaman, Yorktown Heights; Joseph M. Sullivan, Wappingers Falls, all of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/204,851

(22) Filed: Dec. 3, 1998

(51) Int. Cl.⁷ .............................. H01R 12/04; H05K 11/11
(52) U.S. Cl. ............................................ 174/262; 361/767
(58) Field of Search .................................... 174/260, 262, 174/263, 264, 265; 361/767, 770, 783; 439/91

(56) References Cited

U.S. PATENT DOCUMENTS

| | | | |
|---|---|---|---|
| 4,812,191 | 3/1989 | Ho et al. | 156/239 |
| 4,914,814 | 4/1990 | Behun et al. | 29/843 |
| 5,056,215 | 10/1991 | Blanton | 29/840 |
| 5,060,844 | 10/1991 | Behun et al. | 228/180.2 |
| 5,116,459 | 5/1992 | Kordus et al. | 156/631 |
| 5,154,341 | 10/1992 | Melton et al. | 228/180.2 |
| 5,170,931 | 12/1992 | Desai et al. | 228/180.2 |
| 5,174,766 | * 12/1992 | Yoshizawa et al. | 439/91 |
| 5,306,872 | 4/1994 | Kordus et al. | 174/250 |
| 5,338,900 | 8/1994 | Schneider et al. | 174/250 |
| 5,409,157 | 4/1995 | Nagesh et al. | 228/180.22 |
| 5,576,519 | * 11/1996 | Swamy | 174/265 |
| 5,633,535 | 5/1997 | Chao et al. | 257/778 |
| 5,700,715 | 12/1997 | Pasch | 437/183 |
| 5,813,870 | * 9/1998 | Gaynes et al. | 439/91 |
| 5,860,818 | * 1/1999 | Sakaki et al. | 439/91 |
| 6,054,761 | * 4/2000 | McCormack et al. | 257/698 |

* cited by examiner

Primary Examiner—Jeffrey Gaffin
Assistant Examiner—Jeremy Norris
(74) Attorney, Agent, or Firm—Ratner & Prestia; Ira D. Blecker, Esq.

(57) ABSTRACT

A structure for mounting electronic devices which uses a non-conductive, compliant spacer interposed between an underlying carrier and an overlying thin film. The spacer includes a pattern of through-vias which matches opposing interconnects on opposing surfaces of the carrier and the thin film. In this way, solder connections can extend in the through-vias to electrically connect the thin film to the carrier and smooth out topography. In a related process for forming the structure, the thin film is built on a first sacrificial carrier and then further processed on a second sacrificial carrier to keep it from distorting, expanding, or otherwise suffering adversely during its processing. The solder connections between the thin film and the carrier are formed using a closed solder joining process. The spacer is used with laminate cards to create thermal stress release structures on portions of the cards carrying a thin film.

21 Claims, 5 Drawing Sheets

MULTI-LEVEL THIN-FILM ELECTRONIC PACKAGING STRUCTURE AND RELATED METHOD

TECHNICAL FIELD

The present invention relates generally to carriers for electronic device assembly and, more particularly, to a carrier incorporating a polyimide "thin film" structure on the carrier.

BACKGROUND OF THE INVENTION

In a multi-chip module (MCM), a matrix of electronic devices, typically chips, are generally mounted on a multi-level ceramic (MLC) carrier. One of the main functions of such an MLC carrier is to interconnect the chips or other electronic devices mounted to the carrier ("top-to-top" connections) and to interconnect such chips to the input-output or I/O connections of the carrier board ("top-to-bottom" connections).

If the number of chips or chip connections increases, there is a corresponding need to increase the number of layers in the MLC carrier. Such additional layers are needed because there is only so much area available on each layer for the lines and vias which are formed within each ceramic level. For example, one typical MLC module uses line widths of approximately four mils (1 mil=0.001 inches=0.0254 mm), with five mils spacing between the lines, and vias occupying about nine mils. The current art with 100 chips on the carrier requires an MLC carrier of more than 50 layers.

For a variety of performance as well as manufacturing reasons, including cost and yield concerns, it is desirable to limit the number of MLC layers. One solution of the current art is to use "thin films," generally made of polyimide, polymeric material, or other organic material having a low dielectric constant and copper wiring. The polyimide-copper thin film generally can have conductive lines and vias patterned on the thin film at a higher density than typical MLC carriers. The finer line widths and via sizes which can be patterned on thin films therefore allow each layer of a thin film to replace many corresponding layers of an MLC carrier. A typical thin film (TF) has a one-mil line width, a one-mil spacing, and one-mil vias; widths can be as small as one-half a mil, that is, about 13 microns. The higher densities made possible by thin film technology contain or reduce the complexity of MLC carriers. Typically, the thin film is secured to one of the planar surfaces of the MLC carrier and appropriate interconnections are made between the opposing, "mating" surfaces of the thin film and the MLC carrier.

The use of thin films also enhances the ability to repair certain defects in the resulting MLC carrier. Furthermore, the polyimide material and copper lines and vias of a thin film interconnect generally produce better electrical performance than the typical MLC carrier. As such, thin film technology has been a critical part of high-performance interconnect carriers for almost all MCMs.

In spite of its importance to MCM performance and manufacturability, thin film processing has traditionally been a painstaking, slow process with an associated long cycle time. Because the MCM generally comprises a ceramic (MLC) carrier with a thin film processed on top of the carrier, the MLC carrier must be built first, before the thin film processing can begin. Under traditional manufacturing techniques, the MLC carrier must have the surface destined to mate with the thin film properly finished and prepared, especially because thin film processing of the MLC carrier requires a substantially flat, smooth, and pinhole free mating surface.

Another drawback to current thin film manufacturing processes is that, when a thin film is found defective, additional manufacturing steps, including lap and polish, must be undertaken to remove the thin film from the MLC carrier and to prepare the MLC carrier to receive a replacement thin film. Further, large format, multi-up processing of MLCs with thin film is impractical due to the weight and bulk of the ceramic substrates and the unavailability of large-format MLC substrates.

The prior art has attempted to address the aforementioned drawbacks and disadvantages, but has achieved mixed results. For example, in order to reduce thin film processing cycle time and costs, a parallel processing manufacturing technique has been devised. According to this technique, the thin film is processed on a "sacrificial carrier," and is then transferred to the MLC carrier after electrical testing. Parallel processing means that thin film processing can occur separate and apart from the MLC substrate to which the thin film will ultimately be bonded. Parallel processing often also improves the yield of both of the MLC carriers and the thin films, as only those which pass the electrical test will be used together. Furthermore, the use of the sacrificial carrier improves the ability to process thin films in the "multi-up" format.

Although parallel processing may appear to address some of the drawbacks of thin film manufacturing technology, it is nonetheless characterized by several major drawbacks, and is generally less than ideal. One such drawback is, for example, that certain parallel processing techniques often use passive rather than active connections. An example of such a process is found in U.S. Pat. No. 4,812,191 issued to Ho. In such a process, the thin film is formed on an aluminum sacrificial carrier. The thin film is then laminated to an organic board. Connection from thin film to board is made by drilling and through-hole plating. The chip or electronic device is connected by wire bonding to the thin film. It can be appreciated by those skilled in the art that such a connection arrangement is less than ideal, limiting the performance and connection density.

The prior art processes of achieving active via connections with thin film also have drawbacks and disadvantages. In particular, when the thin film has been completely formed on a sacrificial carrier, typically glass according to prior art techniques, the thin film is released from the carrier in a free-standing form by using suitable laser techniques. In techniques disclosed in U.S. Pat. No. 4,812,191; No. 5,170,931; No. 5,258,236; and No. 5,534,094, the thin film is held after release in its free-standing form by a ring or frame which engages the edges of the thin film. The free-standing thin film is then laminated to an MLC carrier or module with its vias aligned with those of the MLC. The via connection between the thin film and the MLC carrier is achieved by gold, thermo-compression bonding.

Many of the drawbacks and disadvantages of this approach relate to the fact that the thin film is released from its sacrificial carrier in a free-standing form before lamination joining with the MLC. When the thin film is thus released, its internal stress generally will cause it to shrink, often by over 0.2% depending on the number of levels of the thin film. The shrinkage of the thin film makes it difficult to align the vias and other electrical connections of the thin film to the corresponding MLC carrier. Such shrinkage, and even distortion, are exacerbated if the thin film is released from its sacrificial carrier too soon in the manufacturing process. The solution of holding the thin film around its edges with a ring or frame after release has the additional disadvantage of reducing the active thin film area.

As a further disadvantage, once the thin film is held in its free-standing form described above, subsequent handling and cleaning of the thin film are difficult. Forces exerted against the thin film while it is being handled or cleaned often result in further distortion of the thin film, rendering its subsequent alignment with the corresponding MLC carrier all the more difficult. Similarly, tests of the thin film when it is in its free-standing form create pressure which may affect not only the results of the tests, but subsequent performance of the thin film itself. Should the thin film become contaminated, it likewise becomes difficult to remove such contamination without applying solution or forces, either of which may damage or distort the thin film.

Gold Compression Bonding

Additional drawbacks to thin film manufacturing techniques of the prior art relate to the use of gold compression bonding. Although reliable, this bonding method takes place at a relatively high temperature, such as 350° C., and relatively high pressure, typically above 200 psi. These high temperatures and pressures may damage and distort the thin film and may also compromise the connections to the thin film.

The high temperature required for this method of joining restricts its use to carriers which can tolerate such temperatures. Because most printed wiring board systems have a maximum operable temperature of 250° C., they cannot receive thin films joined by the gold compression bonding technique. Even when a carrier is used which can tolerate the heat of gold compression bonding, such as an MLC carrier, the high temperature often softens the polyimide material of the thin film, making it more prone to damage and distortion. Further, the high pressures of gold compression bonding often cause distortion in the form of expansion of the thin film. Such expansion often affects the registration of the thin film with the underlying carrier.

The non-rigid, non-planar characteristics of the thin film also cause localized areas of much higher pressure during gold compression bonding. Unlike semiconductor chips, thin films are not rigid structures. Accordingly, pressure applied to the thin film during gold compression bonding is not distributed evenly across the bonding area of the thin film. In addition, the non-planar nature of thin films also tends to cause formation of localized high-pressure points when the film is subjected to pressure.

Such localized pressures cause problems in two major ways. First, the localized pressure will often compress the thin-film interconnections. The thin-film connections extend beyond the intended connection region, creating non-optimal connections at best, and electrical short circuits in more extreme cases. Second, the actual localized pressure can far exceed the yield point of the thin film, damaging the thin film structure itself.

Module interconnection density is also impacted by the use of gold compression bonding. The joining areas of the opposing surfaces of the MLC and the thin film generally must be formed large enough to compensate for the lack of registration between the joining areas caused by the distortion and expansion of thin films from the temperature and pressure of gold compression bonding.

Mismatch of Thermal Coefficient of Expansion (TCE)

Semiconductor chips in many applications are attached to laminate substrates, such as printed circuit boards, rather than to MLC modules. A consistent obstacle in attaching chips to laminate substrates is the mismatch of the thermal coefficient of expansion, or TCE, between the chips and the laminated boards or substrates. This problem is especially acute in the case of direct chip attach. Direct chip attach, or DCA, is a growing trend in the microelectronics industry for many applications. Direct chip attach involves attaching semiconductors directly to a laminate substrate such as a printed circuit board or card.

The mismatch of TCE between chip and board generates shear stress on the chip-to-board connections; such shear stresses result in fatigue of the connections over the life of the product, making those connections prone to failure. In addition, the difference in TCE applies bending forces to the chips at their outer edges and, therefore, may cause the chip to crack.

One attempted solution to alleviate the problems caused by the difference in TCE is to interpose a ceramic carrier between the chip and the laminate board. The ceramic carrier has a TCE between the TCE of the board and that of the chip, thereby minimizing the stresses in the connections. The ceramic carrier also imparts increased rigidity to resist bending moments which would otherwise be applied to the chip. Unfortunately, the foregoing use of ceramic carriers complicates manufacturing and increases costs. The ceramic carrier is also relatively bulky in the context of microelectronics.

Another attempted compensation for the TCE mismatch is to use chip underfill between the chip and the board. Although such use of underfill reduces shear strain, continued presence of these forces limits chip sizes to only about 15 mm in the case of DCA and about 22 mm when the chip is attached to a ceramic substrate with associated underfill. In other words, even with underfill, there is simply too much stress on a chip when the chip dimensions exceed the dimensions mentioned above. This limitation on usable chip sizes is at odds with the ever-increasing size of chips currently being developed—a trend which is likely to continue in the future due to the demands of integrating a multitude of functions on a single chip.

Underfill also interferes with the ability to rework chips which fail testing. Failed chips that cannot be reworked must be discarded. Such waste is especially undesirable in the case of high-performance modules.

Need for Increased Wiring Density

A second problem related to increasing chip sizes is that larger chips are associated with increased wiring density requirements in the underlying substrate. For example, as the number of I/O connections increases, there is a correspondingly greater need for higher-density redistribution wiring. One approach to creating the required redistribution wiring is laminate packaging which uses surface laminar circuit or SLC technology. These types of substrates are produced by processing the basic laminate core panels through serial steps of dielectric and metal depositions and patterning. There are limits to this prior art technology; the basic ground rule (specifying minimum dimensions) for the lines on these build-up layers is two-mil lines with three-mil minimum spacing. The limitation associated with such a ground rule does not accommodate, however, the ever-increasing number of I/O connections and the corresponding need for higher-density redistribution wiring.

From the foregoing discussion, it may be seen that there is a need to process thin films without causing them to be damaged or distorted or to lose their registration with the areas to which they are to be connected. There is also a need to increase the amount of usable area of the thin film. There is a further need to improve the quality of active connections made between the thin film and the underlying carrier. There is a related need to prevent the interconnection structures from collapsing during processing. There is a still further need to accommodate increasing chip sizes by increasing the density of the wiring associated with laminate substrates while keeping stress, strain, and other undesirable forces from damaging the chip or fatiguing the connections to the chip.

SUMMARY OF THE INVENTION

To meet these and other needs, and in view of its purposes, the present invention provides a structure for mounting electronic devices. The structure includes a carrier with a top surface and an array of electrical contacts patterned on the carrier. A multi-layer thin film has its bottom surface connected to the top surface of the carrier. A spacer of non-conductive, compliant material is interposed between the bottom surface of the thin film and the top surface of the carrier. The bottom surface of the thin film also has an array of electrical contacts arranged to correspond to the electrical contacts of the carrier. The spacer has through-vias also arranged in a pattern corresponding to the array of contacts so that one array of contacts is on one side of the through-vias and the other array of contacts is on the other side of the through-vias. A solder connection extends through the through-vias and connects opposing pairs of contacts on the thin film and carrier, respectively.

In accordance with another aspect of the present invention, the carrier, to which the thin film is bonded, is either a multi-layer ceramic substrate or a laminate structure such as a printed circuit card. The solder connections are formed by reflowing opposing pairs of solder balls on the carrier and the thin film using a closed solder joining process. The thin film is built on a first sacrificial carrier, and then further processed by securing it to a second sacrificial carrier. The second sacrificial carrier reduces distortion of, damage to, and surface topography on the thin film during its bonding to the destination carrier and other related processing.

In a related process for forming the structure, first the thin film is built on the first sacrificial carrier and then the second sacrificial carrier is secured to the opposite side of the thin film. The first sacrificial carrier is subsequently removed to expose the surface of the thin film which is to be secured to the multi-layer ceramic substrate or printed circuit card. Solder bumps are formed on contacts on the exposed surface of the thin film. Solder bumps are also formed on contacts of the substrate or card and are arranged to correspond to those of the thin film. The through-vias of the spacer are also arranged in a pattern corresponding to the arrays of solder bumps.

The spacer is then placed on either the exposed surface of the thin film or on the solder-bumped surface of the ceramic substrate or printed circuit card with the through-vias aligned with the solder bumps. The solder bumps of the substrate or card are positioned to oppose and align with corresponding solder bumps of the thin film, thereby forming opposing pairs of the solder bumps. Heat of less than 400° C. and inward pressure of less than 200 psi are applied to the solder bumps in a closed solder joining process, thereby causing the opposing pairs of solder bumps to form solder connections. Non-solder areas are also bonded to provide physical support for the thin film. After the solder connections are formed, the second sacrificial carrier is removed. The resulting structure has a thin film which is bonded and electrically connected to a substrate or card, and which has been processed in a way to reduce distortion of, damage to, and topography variations on the thin film.

In accordance with another aspect of the present invention, the thin film is adhered to a portion of a printed circuit card to form a region of high wiring density. A chip is then secured to the top surface of the thin film, and the I/O connections of the chip are fanned out by redistribution wiring of the thin film. The interposition of the thin film between the card and the chip mounted to the card relieves and redistributes thermal stresses otherwise experienced by the chip.

In accordance with still another aspect of the present invention, a spacer is interposed between the laminate card and the thin film to reduce thermal stresses on the chip secured to the thin film. The adhesive and solder column patterns can be varied between the spacer, thin film, and laminate card to vary the nature of the thermal stress reduction. In one aspect, both sides of the spacer are adhered to the corresponding surfaces of the thin film and the laminate card. In a second aspect, only one side of the spacer is adhered.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE PREFERRED EMBODIMENTS

Referring now to the drawing, the invention in one broad aspect comprises a thin film transfer and joining technology which reduces distortion, stress, surface topography variations, and potential damage of the thin film while increasing the active joining area of the thin film. Broadly, the technology incorporates a second sacrificial carrier, so that the thin film is always rigidly backed, and a spacer of polymeric material which enhances the connection of the thin film to the underlying carrier. The practice of the technology according to the present invention produces a high-performance carrier structure suitable for current and future system architectures.

Figure 1A:
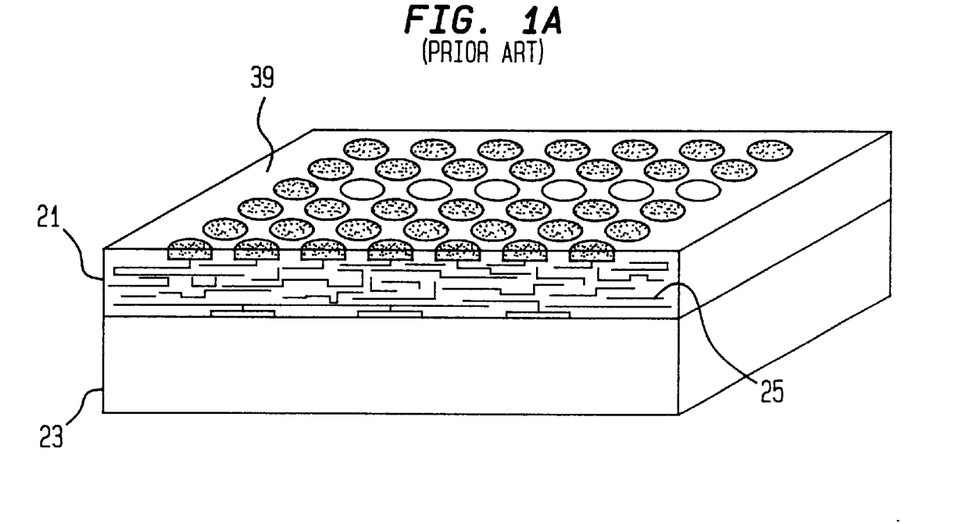
FIGS. 1a and 1b are partial schematic views of prior art processing steps for a thin film and carrier, respectively.

The process for creating the structure according to the present invention is described with reference to FIGS. 1 through 11. FIG. 1a shows a multilayer thin film 21 built on a primary (glass) sacrificial carrier 23 according to techniques of the prior art. The thin film 21 is shown, in this embodiment, with top surface metallurgy (TSM) up. A typical configuration for thin film 21 is for it to have a total thickness of about two mils (approximately 50 $\mu$) with six layers of metal and seven layers of polyimide or other organic insulator. Thin film 21 is patterned in a known manner with lines and vias 25 which are typically about 10 μ wide, and the thin film is generally provided with various test and repair structures. The thin film 21 has a top surface 39.

Figure 1B:
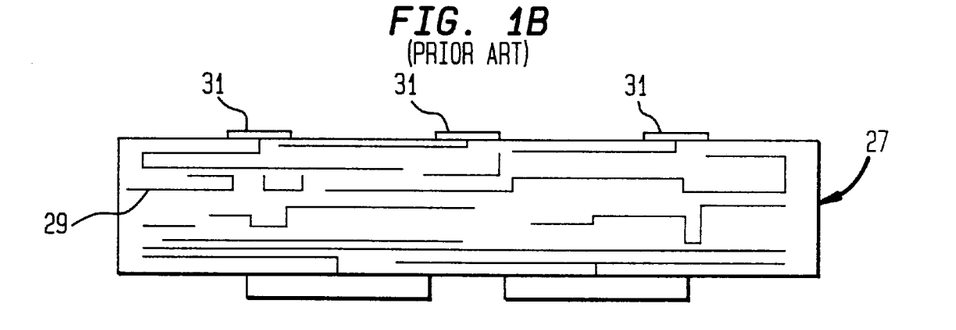

FIG. 1b shows a typical multilayer ceramic (MLC) carrier 27 patterned with appropriate lines and vias 29 and surface metallurgy including contacts 31. To distinguish carrier 27 from the first and second sacrificial carriers used in processing thin film 21, carrier 27 will be called "destination" carrier 27.

Figure 2:
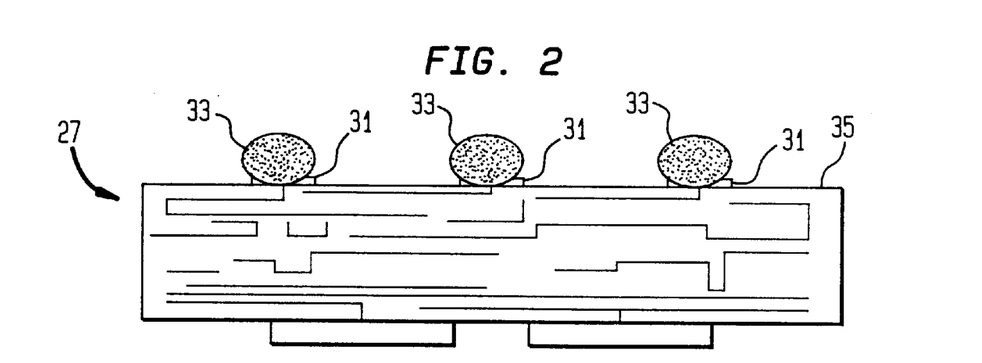
FIGS. 2, 3, and 4 are schematic perspective views of a process and resulting thin film according to the present invention, showing a second sacrificial carrier for processing the thin film.

According to the present invention, solder bumps or balls 33 are applied to the metallurgy or contacts 31 located at top surface 35 of destination carrier 27, as shown in FIG. 2.

Figure 3:
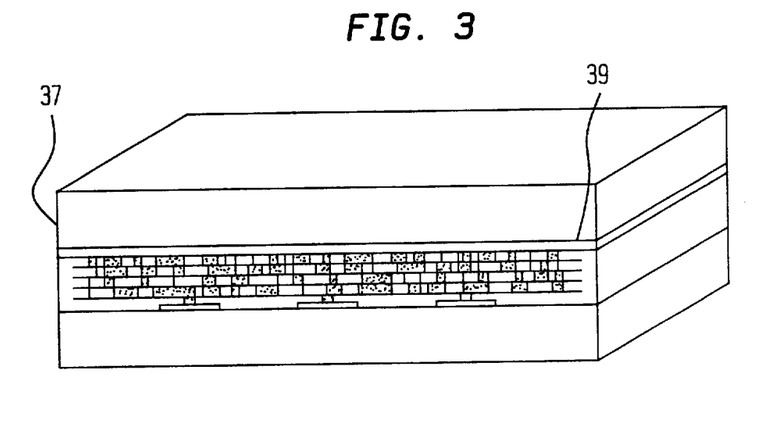

Referring now to FIG. 3, an important aspect of the inventive method and the resulting structure for carrying electronic devices on the structure is the step of securing a second sacrificial carrier 37 to the surface of the thin film opposite the first sacrificial carrier 23. In this case, second sacrificial carrier 37 is secured to top surface 39 of thin film 21. Second sacrificial carrier 37 is preferably a glass which is transparent to laser, having a thickness of one to five millimeters.

Figure 4:
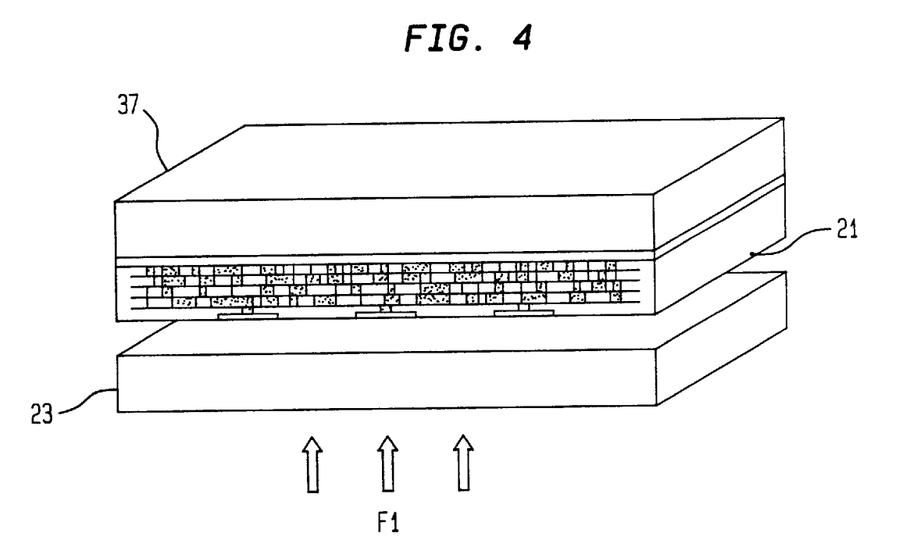

Referring to FIG. 4, the thin film 21 is released from primary sacrificial carrier 23 using an ultraviolet laser in a manner known in the art. After release of primary sacrificial carrier 23, thin film 21 remains rigidly backed by second sacrificial carrier 37. Bottom surface 41 of thin film 21 can be processed while thin film 21 remains rigidly backed and flat, and all process steps to the thin film 21 can be accomplished, including cleaning and testing, while avoiding free-standing moments on thin film 21. Such rigid backing allows thin film 21 to be maintained substantially distortion-free and reduces the risk of damage during cleaning, testing, and other processing steps which might otherwise occur if thin film 21 were processed in free-standing form.

Figure 5:
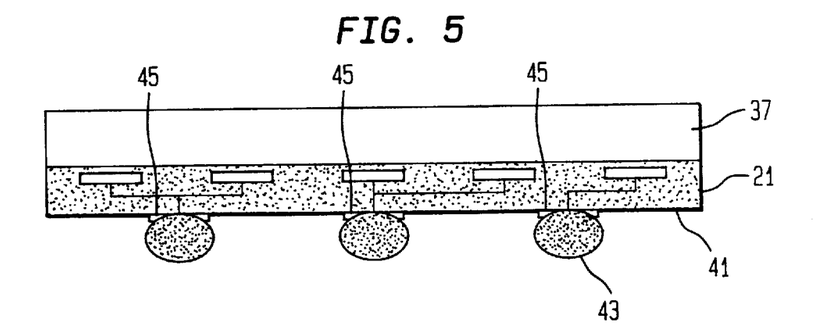
FIGS. 5 through 11 are side-elevation, partial schematic views of the process of creating the structure according to the present invention, with FIG. 11 showing the completed structure according to the present invention suitable for mounting electronic devices to the structure.
Figure 10:
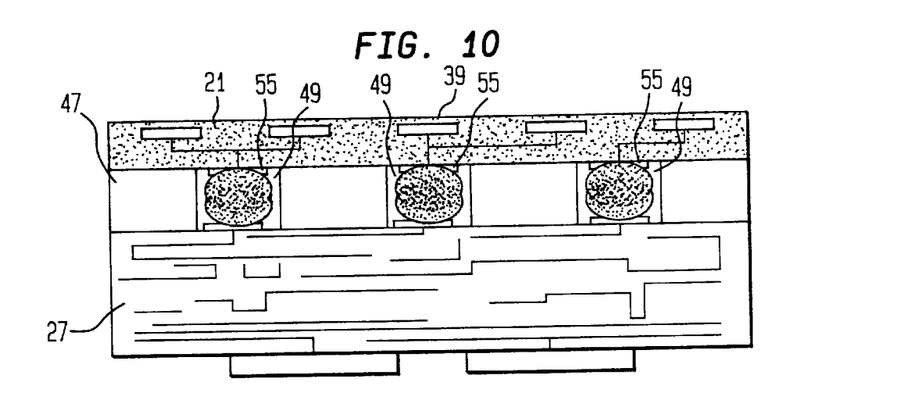

Referring now to FIG. 5, one of the processing steps comprises applying solder bumps 43 to metallurgy pads 45 formed on bottom surface 41 of thin film 21. Preferably, solder bumps 43 are formed by paste screening in glass molds. Flux is used in forming solder bumps 43 on corresponding metallurgy pads 45, and a similar process is used to form solder balls 33 on contacts 31 on destination carrier 27 discussed previously. This flux is removed and the solder bumps are cleaned. As will be discussed in more detail below, solder bumps 43 on thin film 21 are joined with corresponding solder balls 33 on top, mating surface 35 of destination carrier 27 in a closed solder joining process to form closed solder connections 55 (FIG. 10).

Figure 6:
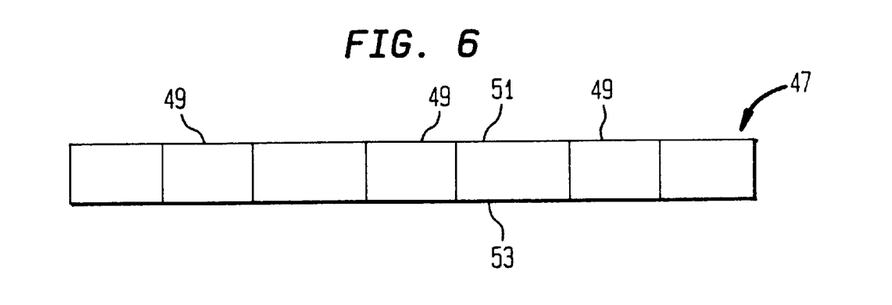

Another important aspect of the present invention is using a polymeric spacer 47, as shown in FIG. 6, which is advantageously interposed between thin film 21 and destination carrier 27. Spacer 47 has a first surface 51 and an opposite surface 53. Through-holes or through-vias 49 extend from first surface 51 through opposite surface 53 and are defined in a pattern corresponding to opposing solder balls 33 and bumps 43. Thus, through-vias 49 align and channel the resulting solder connections 55 (joints or columns) between mating surfaces of thin film 21 and destination carrier 27. Spacer 47 is relatively thick compared to thin film 21; spacer 47 ranges between one and 10 mils in thickness, with about three mils being preferable.

Figure 7:
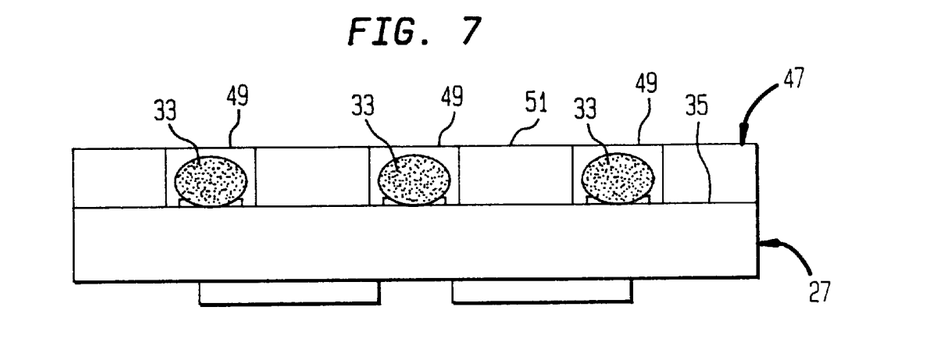

Referring now to FIG. 7, spacer 47 is placed upon top surface 35 in such a way that through-vias 49 register with protruding solder balls 33. The spacer 47 may either be adhered or not adhered to the corresponding mating surfaces of thin film 21 and destination carrier 27. In any case, solder balls 33 act as registration guides for the placement of spacer 47 on destination carrier 27.

Figure 8:
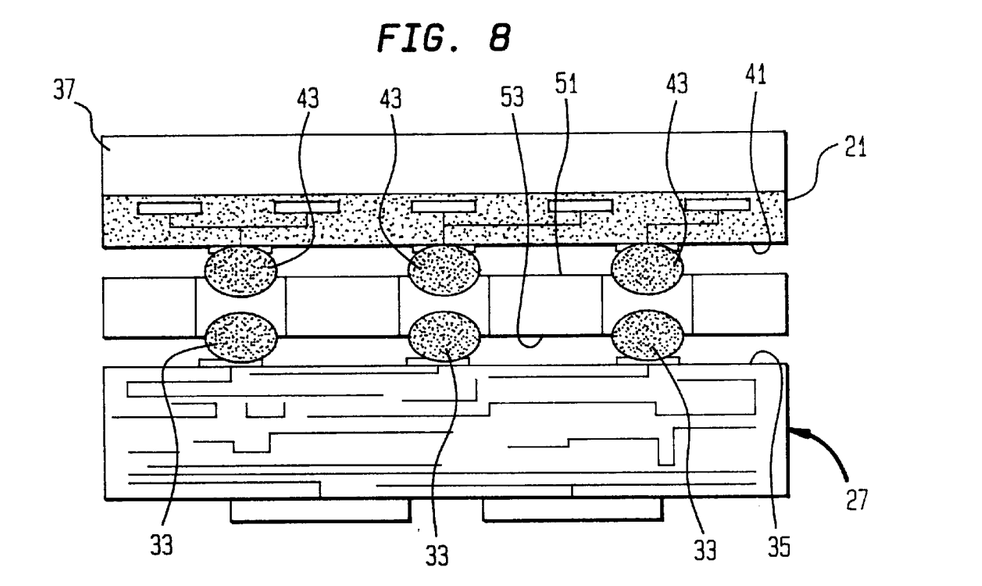

Referring now to FIG. 8, second sacrificial carrier 37 and thin film 21 mounted to it have been flipped and positioned so that solder bumps 43 register with through-vias 49. As such, solder bumps 43 extend partially into through-vias 49 from first surface 51 of spacer 47, while solder balls 33 partially extend into through-vias 49 from opposite surface 53 of spacer 47. Opposing pairs of solder bumps are thus formed in through-vias 49.

Figure 9:
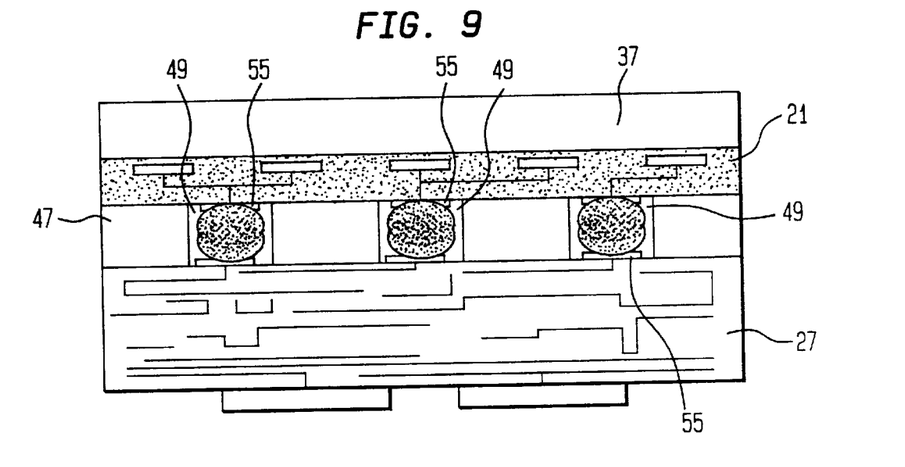

Referring now to FIG. 9, second sacrificial carrier 37 and thin film 21 are joined by closed solder joining methods to destination carrier 27, and are electrically interconnected by the resulting solder connections 55. In particular, although flux is required for solder-to-metal joining while applying solder balls 33 and bumps 43 to the corresponding surface metallurgy, solder balls 33 and bumps 43 are joined to each other without needing to use flux; this is advantageous in that residual flux degrades reliability, and flux is difficult to remove from the joining areas after closed solder joining.

In this embodiment, then, a solder-to-solder joining scheme is used, that is, a closed solder joining technique. Solder balls 33 are joined to corresponding solder bumps 43 in respective through-vias 49 of spacer 47. The solder reflows during this joining operation, thus establishing solder connections 55 within designated through-vias 49 in spacer 47 and thereby creating the required reliable electrical connection. A single reflow run accomplishes adhesion between spacer 47 and both destination carrier 27 and thin film 21.

Figure 11:
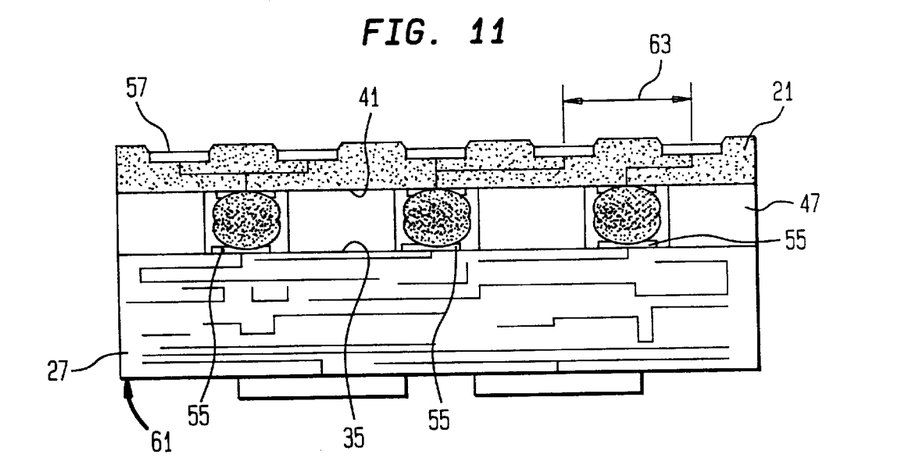

Once the closed solder joining process is complete, second sacrificial carrier 37 is laser-released from top surface 39 of thin film 21, leaving the structure shown in FIG. 10. Top surface 35 is then further ablated to expose chip joining pad surfaces 57. FIG. 11 shows the resulting high-performance structure 61 for mounting electronic devices (not shown) on structure 61. The advantageous features of structure 61 will now be further described.

Thin film 21 has more usable area (greater than 12 inches by 12 inches) available by virtue of having been rigidly backed by second sacrificial carrier 37 during its processing, rather than having its edges retained by a ring as is typical in the prior art. The rigid backing also minimizes shrinkage and distortion, allowing tighter active via pitch 63 of four mils or less and increased wiring densities. The rigid backing also planarizes the thin film surfaces 39 and 41. Such planarization enhances the interconnection processability between chips (not shown) and destination carrier 27, as well as that between thin film 21 and the destination carrier 27.

Because solder connections 55 are formed by closed solder joining, reliable electrical connections are formed without the disadvantages of gold compression bonding. A wide selection of joining temperatures can be used, typically ranging from 50° C. to 450° C. It is particularly advantageous to use joining temperatures less than the 350° C. typically associated with gold compression bonding.

Similarly, far lower pressure is needed to form the solder-to-solder bonds of solder connections 55 than is required for gold compression bonding. Solder connections 55 are formed with as low a pressure as 15 psi. Closed solder joining therefore avoids the distortion, expansion, and other disadvantages of higher-temperature, higher-pressure joining techniques.

The closed solder joining of the present invention also allows the resulting carrier structure 61 to be formed with any of a wide range of via and line spacings, as opposed to the more limited range associated with gold compression bonding. Solder bumps can be placed in a range of 6 to 50 mils pitch. Such a wide range means that a wide range of connection density requirements can be met. The volume of solder in each solder connection 55 is also more readily controlled, again allowing for tighter lines and vias in structure 61.

Because solder connections 55 are formed by the reflow of the closed solder joining process, the connections can more readily adapt to any topography present on the mating surfaces 35, 41. The resulting array of solder connections 55 and the spacer 47 anchors thin film 21 to destination carrier 27, and thereby resists distortion of thin film 21 by securing it at multiple spaced locations. The array of solder connections 55 and spacer 47 itself also distributes the pressure associated with joining thin film 21 to destination carrier 27, thus avoiding undesirable localized pressure.

Spacer 47 is preferably 2–5 mils thick, and its flexibility permits it to compensate for topographical features on mating surfaces 35, 41. Of course, the thickness of spacer 47 can be varied depending on the size of the topography likely to be encountered, but a thickness of 2–5 mils is suitable for the typical topographic variations of two mils generally found on thin films and carriers. The through-vias 49 of spacer 47 receive solder balls 33 and bumps 43 and keep the solder from expanding beyond the designated joining area during reflow. Spacer 47 also keeps solder connections 55 from collapsing under pressures exerted during the joining process.

Furthermore, spacer 47 distributes forces more evenly over thin film bottom surface 41 mated to it, thereby avoiding undesirable regions of high localized pressure on thin film 21 both during and after processing. In particular, the polymeric material of spacer 47 is selected so that spacer 47 is slightly compliant or resiliently compressible. Such compliance distributes or absorbs pressure which might otherwise adversely affect the thin film 21.

Thus, spacer 47 gives overlying thin film 21 better structural support than if thin film 21 were merely supported by solder connections 55. This enhanced structural support is especially important both when the thin film is subjected to pressure and heat during solder bonding and when the solder connections are undergoing thermal stress during use thereafter. Generally, then, spacer 47 imparts increased strength to the entire structure 61 by maintaining solder connections 55, equalizing pressures on thin film 21, and evening topographic variation.

Figure 12:
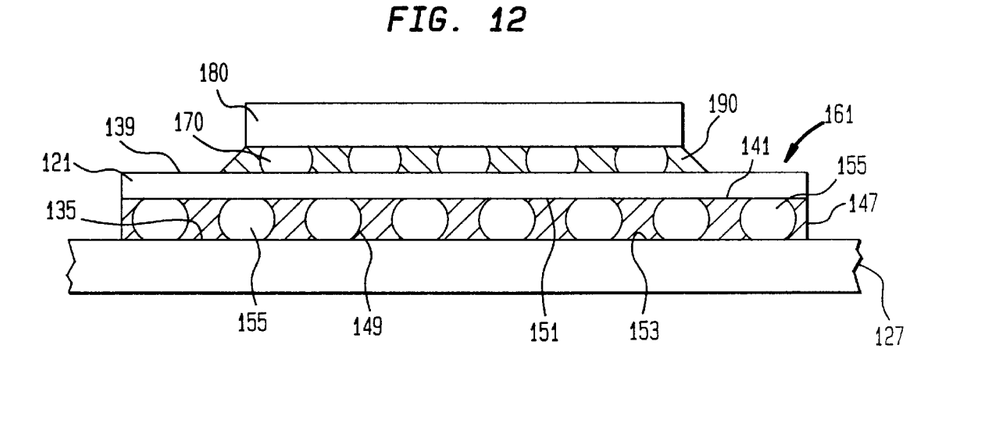
FIGS. 12, 13, and 14 are side-elevation, partial schematic views of three alternatives, respectively, according to the present invention, for chip-on-laminate structures.
Figure 13:
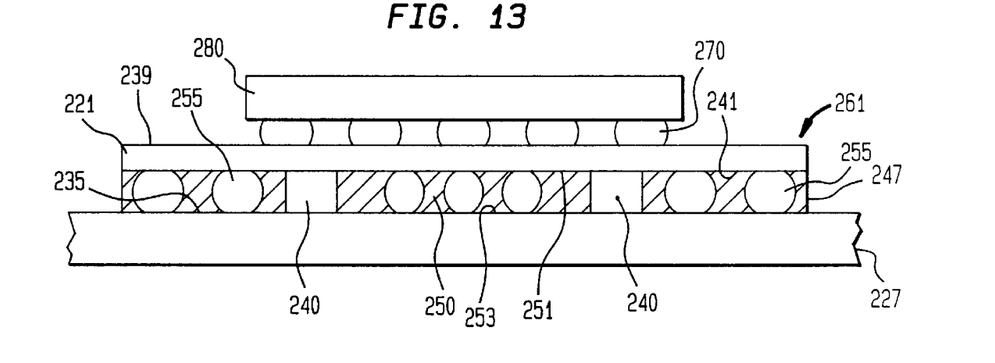
Figure 14:
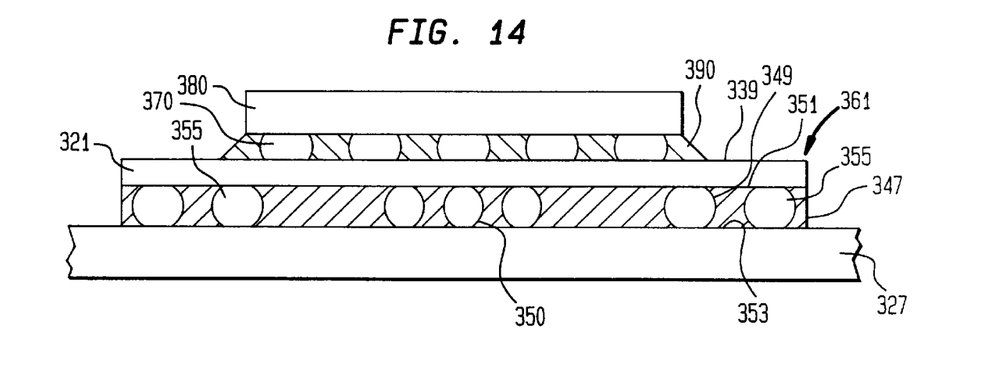

The lower-temperature solder joining characteristics of the present invention allow thin films to be joined to laminate card structures, such as printed circuit boards, without compromising structural integrity. The thin-film-board structures of FIGS. 12, 13, and 14 illustrate three preferred ways to relieve and redistribute stresses generated by the TCE mismatch typical of chips mounted to boards. In general terms, FIGS. 12, 13, and 14 show structures 161, 261, and 361, comprising a laminate substrate or board, a chip, and a thin film with associated elements interposed between the three, main components. In particular, application of the thin film to the laminate substrates, in a manner similar to that discussed above with reference to destination carrier 27, allows the high I/O counts frequently encountered in portions of laminate cards to be effectively fanned out, while the compliant polymeric nature of the thin film reduces the stresses otherwise caused by TCE mismatch.

Referring respectively to FIGS. 12, 13, and 14, polymeric spacers 147, 247, 347, similar in structure to spacer 47 discussed previously, are disposed upon respective destination carriers 127, 227, 327 (e.g., cards or laminates). Thin films 121, 221, and 321 are disposed, in turn, on top of respective spacers 147, 247, 347. Thin films 121, 221, 321 are joined to corresponding destination carriers 127, 227, 327 by the lower-temperature, lower-pressure closed solder joining technique discussed previously, thereby forming solder columns or connections 155, 255, 355.

Preferably, thin films 121, 221, 321 are built by using both a primary and secondary glass carrier in the manner according to the present invention described previously. The thin films 121, 221, 321 and their corresponding spacers and cards have all the structural advantages of less distortion and stress relief discussed with reference to the previous embodiment.

In the embodiments of FIGS. 12, 13, and 14, however, instead of applying the thin films to substantially all of the surface of corresponding destination carriers 127, 227, 327, thin films 121, 221, 321 have dimensions required to fan out the high-density I/Os of an overlying chip. In other words, the thin films 121, 221, 321 are applied to selective regions of corresponding destination carriers in a "postage stamp" fashion to create high-density interconnect structures at those locations where chips are to be joined to respective destination carriers 127, 227, 327.

FIGS. 12, 13, and 14 illustrate three variations of such "postage-stamp" structures 161, 261, 361, such variations now to be described. Referring to FIG. 12, spacer 147 of structure 161 has a substantially continuous pattern of through-vias 149. Uniform spacer 147 is adhered on its opposite planar surfaces 151, 153 to bottom surface 141 of thin film 121 and top surface 135 of destination carrier 127, respectively. Chip 180 is attached to top surface 139 of thin film 121 by suitable chip joining techniques, preferably C4 joints 170 and underfilled with suitable underfill material 190.

Referring now to FIG. 13, through-vias 255 are arranged non-uniformly in spacer 247 so that a region 250 in spacer 247 has a small number of vias through the center of region 250 to conduct power and ground. Region 250 is located beneath chip 280. Spacer 247 is adhered on one or both of its opposite planar surfaces 251, 253 to bottom surface 241 of thin film 221 and top surface 235 of destination carrier 227, respectively. Chip 280 is attached to the top surface 239 of thin film 221 by C4 solder connections 270 and is not underfilled with any underfill material. A window cut out 240 is defined in spacer 247 at lateral locations so as to frame region 250 and overlying chip 280. Cut out 240 extends slightly beyond the edge of chip 280, preferably by about 1 mm. It will be appreciated that the above-described arrangement reduces stresses due to TCE mismatch by decoupling such stresses from the portion of the destination carrier 227 corresponding to region 250, and by equilibrating TCEs by adhering spacer 247 on its opposite surfaces outside the region 250.

Referring now to FIG. 14, through-vias 355 are arranged non-uniformly in spacer 347 so that a region 350 in spacer 347 has a small number of vias through the center of region 350 to conduct power and ground to the overlying chip 380. Region 350 is located substantially beneath chip 380. Spacer 347 is adhered on both of its surfaces 351, 353 to the thin film 321 and the destination carrier 327. Chip 380 is attached to top surface 339 of thin film 321 by C4 solder connections 370, but is underfilled with suitable underfill material 390.

Testing of each of the above-described structures 161, 261, 361 has revealed that the I/O solder connections 155, 255, 355 have strains about three to four times smaller than a control structure datum built using prior art techniques. There is a correlative advantage in the fatigue properties of the above-described structures 161, 261, 361.

Table 1 summarizes the stress-strain analysis data of the three stress relief structures shown in FIGS. 12, 13, and 14.

TABLE 1

| | Strain Analysis Carrier | | | |
|---|---|---|---|---|
| | FIG. 12 | FIG. 13 | FIG. 14 | DATUM |
| C4 w/o underfill | | 0.070 | | 5.43 |
| I/O w/o underfill | | 0.22 | | 1.05 |
| C4 w/ underfill | 0.93 | | 0.83 | 0.62 |
| I/O w/o underfill | 0.52 | | 0.02 | 1.05 |

The strain values above are expressed as percentage of strain for a 17 mm chip cooled from 100 to 0°C.

Adhesion of spacers 147, 247, 347 to portions of opposing surfaces of the destination carrier (e.g., card) or thin film redistributes, redeploys, or otherwise relieves thermal stresses which would otherwise be experienced by corresponding chips 180, 280, 380. Although various patterns of adhering the spacers to opposing surfaces have been discussed in the embodiments of FIGS. 12, 13, and 14, still other adhesive patterns may be used, of course, depending on the particular application, to relieve thermal stresses which would otherwise be transferred to the chips mounted to the thin films.

The thin films 121, 221, 321 provide corresponding structures 161, 261, 361 with localized, tighter-ground rule wiring in regions of high interconnect density. This feature in turn permits current and future chip technologies and system architectures with higher I/O counts and greater wiring densities.

The strain relief afforded by the use of the thin films 121, 221, 321 and corresponding underlying spacers 147, 247, 347 is particularly important for high-end chips and modules on cards. Often underfill is not used in high-end applications because rework processes must be accommodated in such expensive components. Otherwise stated, it is undesirable to discard high-end modules. Instead, they are repaired or reworked. Underfill prevents such reworking. Therefore, a specific problem arises for high-end chips and modules on cards. The thin film-spacer combination of the present invention overcomes that problem by affording strain relief and enhanced fatigue resistance while also allowing repair procedures in such high-end devices.

In one preferred embodiment of the present invention, the laminated destination carriers 127, 227, 327 are 127 mm by 127 mm printed circuit cards. The chip to be mounted to the destination carriers is 25 mm by 25 mm, which is larger than the size generally mounted to such cards today. The thin film-spacer combination interposed between the chip and the destination carrier, which facilitates the larger chip mounting, is preferably sized smaller than the card but large enough to allow for redistribution wiring.

In addition to the advantages apparent from the foregoing description, the thin film processing and closed solder joining techniques and associated spacers produce a high-density carrier in which the interconnect structure is less likely to have been distorted, damaged, or thrown out of registration with underlying areas. Localized stress, shear, strain, and fatigue on the solder interconnects on the destination carriers are reduced. The method and corresponding structures formed by the method are equally useful on MLC modules and laminate substrates such as printed circuit boards; the thin film-spacer combination affords additional structural integrity advantages in both environments.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A structure for mounting semiconductor chips thereon, the structure comprising:
   a destination carrier having a top surface with a first array of conductive contacts thereon;
   a multilayer thin film having a bottom surface connected to the top surface of the destination carrier, the bottom surface having a second array of conductive contacts thereon corresponding to and aligned with the first array of conductive contacts;
   a spacer of nonconductive, compliant material interposed between and in contact with the bottom surface of the thin film and the top surface of the destination carrier;
   the spacer having opposite planar surfaces positioned to oppose the thin film and the destination carrier, respectively;
   the spacer further having a pattern of through-vias extending between the opposite planar surfaces of the spacer to terminate in opposite ends and opposite openings on respective opposite planar surfaces;
   the pattern of through-vias selected to correspond to the first and second aligned arrays of conductive contacts, the conductive contacts of either of the arrays acting as registration guides for alignment of the spacer with the arrays; and
   solder connections extending in the through-vias, each of the solder connections connecting one of the contacts of the first array with a corresponding one of the contacts of the second array, the solder connections being formed by at least one of heat and pressure;
   whereby the spacer redistributes localized regions of pressure which may form on the thin film during formation of the solder connections.

2. The structure of claim 1, wherein the solder connections are formed by a closed solder joining process using temperatures not exceeding about 400° C.

3. The structure of claim 1, wherein the solder connections are formed by application of heat and pressure, and wherein the thin film is carried on a second sacrificial carrier until after the solder connections are formed, thereby keeping the thin film rigidly backed during application of the heat and pressure needed to form the solder connections.

4. The structure of claim 1, wherein the destination carrier is selected from the group consisting of a multi-level ceramic substrate and a laminate card.

5. The structure of claim 1, wherein the spacer is formed from a polymeric material and has a thickness of between about 2 mils and about 5 mils.

6. The structure of claim 1, wherein the opposite surfaces of the spacer are against the bottom surface of the thin film and the top surface of the destination carrier, respectively.

7. The structure of claim 6, wherein the opposite surfaces of the spacer are adhered in substantial contact with the bottom surface of the thin film and the top surface of the destination carrier, respectively.

8. The structure of claim 7, wherein the destination carrier comprises a laminate card.

9. A laminate card comprising:
  a substrate having a top surface with a first array of conductive contacts thereon;
  a multilayer thin film having a bottom surface connected to the top surface of the substrate, the bottom surface having a second array of conductive contacts thereon corresponding to and aligned with the first array of conductive contacts;
  a spacer of nonconductive, compliant material interposed between and in contact with the bottom surface of the thin film and the top surface of the substrate;
  the spacer having opposite planar surfaces positioned to oppose the bottom surface of the thin film and the top surface of the substrate, respectively;
  the spacer further having a pattern of through-vias extending between the opposite planar surfaces of the spacer to terminate in opposite ends and opposite openings on the respective planar surfaces;
  the pattern of through-vias selected to correspond to the first and second aligned arrays of conductive contacts, the conductive contacts of either of the arrays acting as registration guides for alignment of the spacer with the arrays;
  solder connections extending in the through-vias, each of the solder connections connecting one of the contacts of the first array with a corresponding one of the contacts of the second array, whereby the spacer redistributes localized regions of pressure which may form on the thin film during formation of the solder connections;
  wherein the solder connections are formed by applying heat in a range of about 150° C. and 250° C. and pressure between about 20 psi and 200 psi, and wherein the thin film is carried on a second sacrificial carrier until after the solder connections are formed, thereby keeping the thin film rigidly backed during application of the heat and pressure needed to form the solder connections.

10. The card of claim 9 further comprising a chip mounted thereon, wherein the spacer is adhered to at least one of the bottom surface of the thin film and the top surface of the substrate to redistribute thermal stresses otherwise transferred to the chip.

11. A multilayer ceramic module comprising:
  a substrate having a top surface with a first array of conductive contacts thereon;
  a multilayer thin film having a bottom surface connected to the top surface of the substrate, the bottom surface having a second array of conductive contacts thereon corresponding to and aligned with the first array of conductive contacts;
  a spacer of nonconductive, compliant material interposed between the bottom surface of the thin film and the top surface of the substrate;
  the spacer having opposite planar surfaces positioned to oppose the bottom surface of the thin film and the top surface of the substrate, respectively;
  the spacer further having a pattern of through-vias extending between the opposite planar surfaces of the spacer to terminate in opposite ends and opposite openings on the respective planar surfaces;
  the pattern of through-vias selected to correspond to the first and second aligned arrays of conductive contacts, the conductive contacts of either of the arrays acting as registration guides for alignment of the spacer with the arrays;
  solder connections extending in the through-vias, each of the solder connections connecting one of the contacts of the first array with a corresponding one of the contacts of the second array, whereby the spacer redistributes localized regions of pressure which may form on the thin film during formation of the solder connections;
  wherein the top and bottom surfaces have solder bumps on respective contacts, the solder bumps of the top and bottom surfaces being received in corresponding openings of the through-vias to form an array of opposing pairs of solder bumps, the opposing solder bumps being bonded to each other to form the solder connections;
  wherein the solder connections are formed by applying heat in a range of about 150° C. and 400° C. and pressure between about 20 psi and 200 psi, and wherein the thin film is carried on a second sacrificial carrier until after the solder connections are formed, thereby keeping the thin film rigidly backed during application of the heat and pressure needed to form the solder connections.

12. The module of claim 11, wherein the spacer is sufficiently compliant to conform to topographic variation of the top and bottom surfaces.

13. The module of claim 12, wherein the through-vias are dimensioned to retain the solder of the solder bumps received therein during formation of the solder connections and to inhibit collapse of the solder connections during formation.

14. A structure for mounting semiconductor chips thereon, the structure comprising:
  a destination carrier having a top surface with a first array of conductive contacts thereon having solder bumps;
  a multilayer thin film having a bottom surface connected to the top surface of the destination carrier, the bottom surface having a second array of conductive contacts thereon having solder bumps corresponding to and aligned with the first array of conductive contacts;
  a spacer of nonconductive, compliant material interposed between the bottom surface of the thin film and the top surface of the destination carrier;
  the spacer having opposite planar surfaces positioned to oppose the thin film and the destination carrier, respectively;
  the spacer further having a pattern of through-vias extending between the opposite planar surfaces of the spacer to terminate in opposite ends and opposite openings on respective opposite planar surfaces with the solder bumps of the top surface of the destination carrier and the bottom surface of the multilayer thin film being received in corresponding openings of the through-vias to form an array of opposing pairs of solder bumps, the opposing solder bumps being reflowed to form the solder connections;
  the pattern of through-vias selected to correspond to the first and second aligned arrays of conductive contacts, the conductive contacts of either of the arrays acting as registration guides for alignment of the spacer with the arrays; and
  solder connections formed by a closed solder joining process using temperatures not exceeding about 400° C. and extending in the through-vias, each of the solder connections connecting one of the contacts of the first array with a corresponding one of the contacts of the second array;
  whereby the spacer redistributes localized regions of pressure which may form on the thin film during formation of the solder connections.

15. The structure of claim 14, wherein the solder bumps are bonded together without using flux.

16. A structure for mounting semiconductor chips thereon, the structure comprising:

a destination carrier comprising a laminate card, and having a top surface with a first array of conductive contacts thereon;

a multilayer thin film having a bottom surface connected to the top surface of the destination carrier, the bottom surface having a second array of conductive contacts thereon corresponding to and aligned with the first array of conductive contacts;

a spacer of nonconductive, compliant material interposed between the bottom surface of the thin film and the top surface of the destination carrier;

the spacer having opposite planar surfaces positioned against the bottom surface of the thin film and the top surface of laminate card, respectively, only one planar surface of the spacer adhered to one of the thin film and the laminate card;

the spacer further having a pattern of through-vias extending between the opposite planar surfaces of the spacer to terminate in opposite ends and opposite openings on respective opposite planar surfaces;

the pattern of through-vias selected to correspond to the first and second aligned arrays of conductive contacts, the conductive contacts of either of the arrays acting as registration guides for alignment of the spacer with the arrays; and solder connections extending in the through-vias, each of the solder connections connecting one of the contacts of the first array with a corresponding one of the contacts of the second array, the solder connections being formed by at least one of heat and pressure;

whereby the spacer redistributes localized regions of pressure which may form on the thin film during formation of the solder connections.

17. A structure for mounting semiconductor chips thereon, the structure comprising:

a destination carrier comprising a laminate card having a top surface with a first array of conductive contacts thereon;

a multilayer thin film having a bottom surface connected to the top surface of the destination carrier, the bottom surface having a second array of conductive contacts thereon corresponding to and aligned with the first array of conductive contacts;

a spacer of nonconductive, compliant material interposed between the bottom surface of the thin film and the top surface of the destination carrier;

the spacer having opposite planar surfaces positioned against the bottom surface of the thin film and against the top surface of the destination carrier, respectively;

the spacer further having a pattern of through-vias extending between the opposite planar surfaces of the spacer to terminate in opposite ends and opposite openings on respective opposite planar surfaces;

the pattern of through-vias selected to correspond to the first and second aligned arrays of conductive contacts, the conductive contacts of either of the arrays acting as registration guides for alignment of the spacer with the arrays; and the spacer having a first region having an area corresponding to the planar area of a chip to be mounted thereon, wherein the first region has fewer through-vias defined therein per unit area than surrounding portions of the spacer and correspondingly fewer of the solder connections per unit area; and solder connections extending in the through-vias, each of the solder connections connecting one of the contacts of the first array with a corresponding one of the contacts of the second array, the solder connections being formed by at least one of heat and pressure;

whereby the spacer redistributes localized regions of pressure which may form on the thin film during formation of the solder connections.

18. The structure of claim 17, wherein the spacer has a second region having more of the through-vias per unit area than surrounding portions of the spacer and corresponding solder connections therethrough for supplying power to the structure.

19. A laminate card comprising:

a chip;

a substrate having a top surface with a first array of conductive contacts thereon;

a multilayer thin film to which the chip is adhered without underfill material and having a bottom surface connected to the top surface of the substrate, the bottom surface having a second array of conductive contacts thereon corresponding to and aligned with the first array of conductive contacts;

a spacer of nonconductive, compliant material interposed between the bottom surface of the thin film and the top surface of the substrate;

the spacer having opposite planar surfaces positioned to oppose the bottom surface of the thin film and the top surface of the substrate, respectively, and adhered to at least one of the bottom surface of the thin film and the top surface of the substrate to redistribute thermal stresses otherwise transferred to the chip;

the spacer having a window cut out having an outer dimension substantially corresponding in size and location to the perimeter of the chip;

the spacer further having a pattern of through-vias extending between the opposite planar surfaces of the spacer to terminate in opposite ends and opposite openings on the respective planar surfaces;

the pattern of through-vias selected to correspond to the first and second aligned arrays of conductive contacts, the conductive contacts of either of the arrays acting as registration guides for alignment of the spacer with the arrays;

solder connections extending in the through-vias, each of the solder connections connecting one of the contacts of the first array with a corresponding one of the contacts of the second array, whereby the spacer redistributes localized regions of pressure which may form on the thin film during formation of the solder connections;

wherein the solder connections are formed by applying heat in a range of about 150° C. and 250° C. and pressure between about 20 psi and 200 psi, and wherein the thin film is carried on a second sacrificial carrier until after the solder connections are formed, thereby keeping the thin film rigidly backed during application of the heat and pressure needed to form the solder connections.

20. The card of claim 16, wherein the window cut out comprises a frame surrounding a first region of the spacer with fewer through vias per unit area than other areas of the spacer.

21. The card of claim 20, wherein the spacer has a second region having more of the through-vias per unit area than surrounding portions of the spacer and corresponding solder connections therethrough for supplying power to the card.

* * * * *

UNITED STATES PATENT AND TRADEMARK OFFICE
CERTIFICATE OF CORRECTION

PATENT NO. : 6,281,452 B1
DATED : August 28, 2001
INVENTOR(S) : Chandrika Prasad et al.

It is certified that error appears in the above-identified patent and that said Letters Patent is hereby corrected as shown below:

<u>Column 16,</u>
Line 58, delete "16" and insert -- 19 --.

Signed and Sealed this

Twenty-seventh Day of August, 2002

Attest:

JAMES E. ROGAN
Attesting Officer  Director of the United States Patent and Trademark Office